United States Patent
Hoste et al.

(10) Patent No.: US 6,740,624 B1
(45) Date of Patent: May 25, 2004

(54) SPRAYING METHOD TO FORM A THICK COATING AND PRODUCTS OBTAINED

(75) Inventors: Serge Hoste, Merelbeke (BE); Frans Persyn, Lochrist (BE); Isabel Van Driessche, Waasmunster (BE)

(73) Assignee: Universiteit Gent, Zwevegem (BE)

(*) Notice: Subject to any disclaimer, the term of this patent is extended or adjusted under 35 U.S.C. 154(b) by 0 days.

(21) Appl. No.: 09/700,989

(22) PCT Filed: May 26, 1999

(86) PCT No.: PCT/EP99/03599

§ 371 (c)(1),
(2), (4) Date: Jan. 29, 2001

(87) PCT Pub. No.: WO99/61674

PCT Pub. Date: Dec. 2, 1999

(30) Foreign Application Priority Data

May 26, 1998 (EP) .............................................. 98870120

(51) Int. Cl.[7] .......................... H01L 34/24; B05D 5/06; B05D 5/12
(52) U.S. Cl. ........................ 505/480; 505/238; 505/511; 505/737; 505/818; 428/701; 428/702; 428/930; 427/62; 204/192.24
(58) Field of Search ................................ 926/469, 697, 926/701, 702, 430; 505/230, 238, 446, 473, 480, 511, 731, 734, 737, 818; 427/34, 62, 423; 204/192.15, 192.24, 296.12, 298.02

(56) References Cited

U.S. PATENT DOCUMENTS

| | | | | |
|---|---|---|---|---|
| 5,196,400 A | | 3/1993 | Chen .............................. 505/1 |
| 5,489,573 A | * | 2/1996 | DeLuca et al. ............. 427/343 |
| 5,814,585 A | * | 9/1998 | Riddle et al. ................ 505/121 |
| 5,863,336 A | * | 1/1999 | Tkaczyk et al. ............. 118/718 |
| 5,863,604 A | * | 1/1999 | Hunt et al. ............... 427/248.1 |
| 6,013,318 A | * | 1/2000 | Hunt et al. ............... 427/248.1 |
| 6,188,921 B1 | * | 2/2001 | Otto et al. ..................... 427/62 |
| 6,254,940 B1 | * | 7/2001 | Pratsinis et al. ............. 423/289 |

FOREIGN PATENT DOCUMENTS

| | | |
|---|---|---|
| CH | 648 358 | 3/1985 |
| DE | 277 471 | 4/1990 |
| DE | 4015387 | 11/1991 |
| EP | 0 330 196 | 8/1989 |
| EP | 0 377 073 | 7/1990 |
| EP | 0 586 809 | 3/1994 |
| GB | 2 121 780 | 1/1984 |
| WO | WO 89/08333 | 9/1989 |

OTHER PUBLICATIONS

Cukauskas, E.J. et al. "The properties of YBCO thin films with silver doping prepared by spray pyrolysis" J. of Appl. Phys. 67 (11), Jun. 1, 1990, pp. 6946–6952.*

Abeutis, A. et al. "Synthesis of silver–containing hich Tc superconducting films using spray–pyrolysis method" J. Mater. Res. Vo 7, No 11, Nov. 1992, pp. 2942–2947.*

Van Driessche, "Development of High Power Magnetron Sputtering Targets Prepared by Flame Spraying", Inst. Phys. Conf. Ser. No. 158, Jun. 30–Jul. 3, 1999, p. 141–144.

* cited by examiner

*Primary Examiner*—Kiley Stoner
*Assistant Examiner*—Colleen P. Cooke
(74) *Attorney, Agent, or Firm*—Barnes & Thornburg

(57) ABSTRACT

A method and an apparatus for spraying materials onto a substrate to produce a coating thereon is described which allows very thick layers of complex metal oxides to be produced. The apparatus and method are particularly suitable for producing superconducting coatings.

9 Claims, 3 Drawing Sheets

SPRAYING METHOD TO FORM A THICK COATING AND PRODUCTS OBTAINED

The present invention relates an apparatus and a method of spraying to form a coating on flat or curved substrates, for example, either as part of the direct formation of metallic or ceramic coatings such as superconductive or piezo-electric layers or for the production of targets for sputtering magnetrons having coatings which are precursors of such layers.

TECHNICAL BACKGROUND

From EP-A-286 135 it is known to flame spray complex ceramic materials onto a substrate such as a tape to form a superconducting layer. It is suggested to pre-heat the substrate to temperatures above 540° C. and to cool the coating slowly. It is further recommended to treat the coating in an atmosphere containing one of the components of the superconducting ceramic. An oxy-acetylene flame is used for the flame spraying. Thickness of up to 3 mm are described.

It is also known from U.S. Pat. No. 5,196,400 to plasma spray a coating onto a target for use in a sputtering magnetron to sputter a Y—Ba—CuO superconductor coating. Deposition of only a thin target coating of 0.5 mm is reported.

The production of superconducting powders using flame spraying is reported in U.S. Pat. No. 5,140,005. An oxy-acetylene flame is used. It is tacitly accepted that the high temperature of the flame changes the stoichiometric ratios of the components and that this has to be compensated by increasing the more volatile components in the original mixtures. U.S. Pat. No. 5,045,365 describes a method of cooling a oxy-acetylene flame-sprayed substrate with water. Without special precautions, water cooling is unsuitable for superconductors due to the water vapour produced.

EP-A-355 736 describes production of flat targets with metal oxides up to a layer thickness of 3 mm. WO 98/0833 describes the production of <20 micron thick layers of superconducting metal oxide mixtures.

The article by Murakami et. al. "Rapidly Solidified Thick Deposit Layers of Fe—C—Mo Alloys by Flame Spraying" describes up to 1.5 mm thick rapidly cooled thick layers of Fe—C—Mo alloys by flame spraying. Special precautions were taken to produce dense layers, e.g. direct application of cryogenic gas on the coating during application.

EP-A-586 809 describes the metal spraying application of a layer of relatively homogeneous material (nickel coated silicon) which is much easier to handle than the heterogeneous oxide mixtures contemplated by the present invention. Layer thicknesses of up to 8 mm are described but 3 to 5 mm is preferred. Various layers are proposed including a Ni—Al layer for improving adhesion between the deposited layer and the substrate. A Ni—Al adhesion promoter is known from DE-A-33 18 828.

Plasma spraying of superconducting materials is described in EP-A-2887 11 up to a thickness of 250 micron.

It is an object of the present invention to provide an apparatus and a method of spraying heterogeneous metal oxides to form a ceramic coating on flat or curved substrates.

It is a further object of the present invention to provide an apparatus and a method of spraying heterogeneous metal oxides to form a thick walled ceramic coating on flat or curved substrates which is structurally sound.

It is a further object of the present invention to provide an apparatus and a method of spraying to form a thick walled coating of a superconducting ceramic material.

It is still a further object of the present invention to provide an apparatus and a method of spraying suitable for forming a thick walled ceramic coating on flat or curved targets to be used in a sputtering magnetron.

It is still another object of the present invention to provide a method of producing a (magnetron) vacuum sputtering target as well as the target itself with improved thermal and electrical conductivity and high mechanical strength using a spraying process employing dedicated powder formulations.

SUMMARY OF THE INVENTION

One aspect of the present invention is to provide a substrate with a coating of a combination of metal oxides having a thickness greater than 3 mm more preferably greater than 5 mm and most preferably greater than 8 mm. Preferably, the coating is deposited by spraying, e.g. flame or plasma spraying. Preferably, the substrate is cylindrical and is more preferably is suitable as a cylindrical target substrate for a sputtering magnetron. The combination of oxides preferably comprises at least a superconductive precursor or a superconductor. The thermal conductivity of the deposited material is preferably between 1 and 5 $Wm^{-1}K^{-1}$. When deposited on a steel substrate the thermal conductivity of the composite preferably lies within the range 25 to 125 $Wm^{-1}K^{-1}$. These values are particularly preferred for $YBa_2Cu_3O_7$ coatings. Preferably, an adhesion promoter layer is applied onto the substrate before application of the coating of the metal oxide combination. The adhesion promoter may be a layer of Ni—Al or a layer of an In-alloy, for example. The deposited coating is preferably impact resistant, e.g. withstands impact of a 0.036 kg steel ball from a height of 2 meters. Preferably, about 20% or up to 30% of a noble metal is included in the oxide material to improve electrical and thermal properties of the deposited layer. The noble metal is preferably silver. The noble metal may in included as a salt or oxide, e.g. silver nitrate or silver oxide, in the material to be sprayed. Preferably, the electrical resistivity of the deposited layer is lower than $15\times10^{-6}$ Ohm.m, more preferably lower than $10\times10^{-6}$ and most preferably less than $5\times10^{-6}$ Ohm.m. Values below $1\times10^{-6}$ Ohm.m can be achieved. Up to 30% of a noble metal such as silver may be added to lower the resistivity. These values are particularly preferred for $YBa_2Cu_3O_7$ coatings.

The electrical, thermal and mechanical properties of the coating deposited in accordance with the present invention should be sufficient that the deposited layer can be applied to a suitable substrate by means of a sputtering magnetron preferably at a static sputtering deposition speed of at least 5 nm/minute, more preferably, at 20 nm/minute and most preferably at at least 40 nm/minute.

When a superconductor precursor or a superconductive material is deposited, at least 10% of the coating is in the superconducting phase, more preferably 15%. This may be assisted by a subsequent limited thermal treatment, e.g. 3 hours and 940° C., after deposition.

The present invention also includes a method of depositing by spraying a superconductor precursor layer onto a cylindrical target for a sputtering magnetron, the layer having a thickness of at least 3 mm, and at least 10% of the layer being in a superconductive phase. The present invention also includes a method of depositing by spraying a layer onto a substrate, the layer having a thickness of at least 5 mm, and the coating comprising metal oxides.

In accordance with one aspect of the present invention a flame spraying apparatus is provided for depositing a metal oxide combination onto a substrate to produce a coating thereon, comprising: a burner for producing a flame; an inlet for feeding material to be sprayed through the flame, the flame imparting a temperature to the material to be sprayed of 1500° C. or less, preferably 1200° C. or less. Preferably the temperature imparted may be a little higher than the melting point of the powder to be sprayed, e.g. 600 to 1000° C. for some metal oxides. Preferably, the thickness of the deposited coating is greater than 3 mm more preferably greater than 5 mm and most preferably greater than 8 mm.

Another aspect of the present invention is to provide a flame spraying apparatus for depositing a metal oxide combination onto a substrate to produce a coating thereon, comprising: a flame spraying gun; and a cooling system for the substrate, the cooling system including a device for bringing a cryogenic fluid into contact with the substrate. Preferably, the thickness of the deposited coating is greater than 3 mm more preferably greater than 5 mm and most preferably greater than 8 mm. The input material for the sprayer may be a liquid solution of soluble compounds (e.g. nitrates) which decompose thermally into ceramic component oxides, liquid slurries of the ceramic components or metal powders, or dry metal or ceramic powders or precursors of the ceramic components, e.g. nitrates, of such powders.

The present invention may provide a method of flame spraying a combination of metal oxide materials onto a substrate to produce a coating thereon, comprising: generating a flame; feeding the material to be sprayed through the flame, the flame imparting a temperature to the material to be sprayed of 1500° C. or less, preferably 1200° C. or less. Preferably the temperature imparted may be a little higher than the melting point of the powder to be sprayed, e.g. 600 to 1000° C. for some metal oxides.

The present invention may also provide a method of flame spraying metal oxide combinations onto a substrate to produce a coating thereon, comprising: generating a flame for spraying the materials; and cooling the substrate by bringing a cryogenic fluid into contact with the substrate.

The present invention may also provide a method of flame spraying a superconducting ceramic material or a precursor thereof onto a substrate to produce a coating thereon, comprising: generating a flame for spraying the ceramic material; depositing the coating on the substrate; and during deposition of the coating, cooling the substrate so that the solidified coating thereon has a temperature between room temperature (~25° C.) and 150° C., preferably room temperature (~25° C.) and 100° C. Water or cryogenic fluid cooling are particularly preferred.

One linking concept between the above methods and apparatus is control of the total heat energy into the spraying/coating system. This can be achieved by careful control of parameters which influence the energy input such as spraying distance, spray head traverse speed, rotation speed of a cylindrical substrate, powder dwell time in the hot exit plume from the spray head, particle velocity exiting the spray head, cooling method and rate of cooling the substrate during coating deposition.

The present invention also includes a method of reconditioning a target for a sputtering magnetron by flame spraying or atmospheric plasma spraying as well as a reconditioned target as made in accordance with the method. The target material or coating is preferably a ceramic coating, in particular a superconducting or superconductor precursor coating.

The final coating is preferably a metallic or ceramic layer, in particular a superconducting or piezo-electric layer or a precursor thereof. The present invention includes a method of spray drying a liquid to form a powder suitable for flame spraying. The spray dried powder may be sintered. The present invention also includes a manufacturing method for depositing a coating on a substrate comprising the steps of: spray drying a precursor liquid to form a powder and flame spraying the powder to form a coating on a substrate. The substrate may be a target for a sputtering magnetron and the final coating may sputtered onto a final substrate in the sputtering magnetron. The ceramic powder may be sintered after the spray drying step. The flame of the flame spray gun preferably imparts a temperature to the powder to be sprayed of 1500° C. or less, preferably 1200° C. or less. Preferably the temperature imparted may be a little higher than the melting point of the powder to be sprayed, e.g. 600 to 1000° C. for some metal oxides. During flame spraying the target is preferably cooled by bringing a cryogenic fluid into contact with the target. In particular the cooling device should maintain the solidified coating at a temperature between room temperature (~25° C.) and 150° C., more preferably between room temperature (~25° C.) and 100° C.

The present invention includes an apparatus for spray drying a liquid to form a powder suitable for flame spraying. The present invention may also include an apparatus for depositing a coating on a substrate comprising: a spray drier for drying a precursor liquid to a powder, and a flame sprayer for flame spraying the powder to form a coating on a substrate. The substrate may be a target for a magnetron. Additionally, a sputtering magnetron for sputtering the final coating onto the final substrate using the target may be provided. The flame of the flame spray gun preferably imparts a temperature to the powder to be sprayed of slightly above the melting point of the sprayed material. Preferably the temperature imparted is 1500° C. or less, preferably 1200° C. or less. Temperatures of 600 to 850° C. may be suitable for some metal oxides. In the flame sprayer a cooling system for the target is preferably provided, the cooling system including a device for bringing a cryogenic fluid into contact with the target. In particular the cooling device should maintain the solidified coating at a temperature between room temperature (~25° C.) and 150° C., more preferably between room temperature (~25° C.) and 100° C.

The above methods may be used, for example, either as part of the direct formation of superconductive or piezo-electric layers on the substrate, e.g. a tape, or for the production of coatings on targets for use in a sputtering magnetron to sputter a superconducting layer onto a final substrate. The present invention may provide oxide sputtering targets supporting very high power dissipation thus enabling high sputter deposition rates of at least 50 nm/min.

The dependent claims describe additional individual embodiments of the present invention. The present invention will now be described with reference to the following drawings.

DESCRIPTION OF THE ILLUSTRATIVE EMBODIMENTS

The present invention will be described with reference to certain specific embodiments and with reference to certain specific drawings but the invention is not limited thereto but only by the claims. In particular, the present invention will mainly be described with reference to the deposition of a superconductor precursor or superconductive coatings but the invention is not limited thereto but may be used advantageously with other heterogeneous coatings such as ceramic coatings, particularly those having special properties such as piezo-electric coatings and in particular coatings which contain components which can be degraded by high temperatures or which are more volatile than other components. More particularly the present invention will be described with reference to the manufacture of $YBa_2Cu_3O_7$ superconducting powders and coatings but the invention is not limited thereto but only by the claims. Further one way of carrying out the present invention will be described with reference to low temperature flame spraying but the present invention is not limited thereto. By carrying out the invention in accordance with the processing details and principles described below thick layer (greater than 3 mm, more preferably greater than 5 mm and most preferably greater than 8 mm) metal oxide combination coatings suitable for use as a sputtering magnetron target have been applied by oxy-acetylene flange spraying with water cooling or by atmospheric pressure or low-pressure plasma spraying to substrates including cylindrical substrates used in rotating cathode magnetrons. During plasma spraying gasses may be used such as argon or mixtures of argon and other gasses to shield the plasma spray. Also the present invention will mainly be described with reference to an input to the flame spraying head of spray dried powder. The present invention is not limited thereto but includes other forms of input materials such as a mixture of the metal oxides, including slurries thereof or mixtures of precursors of metal oxides such as metal nitrates as well as slurries and solutions thereof.

Figure 1:
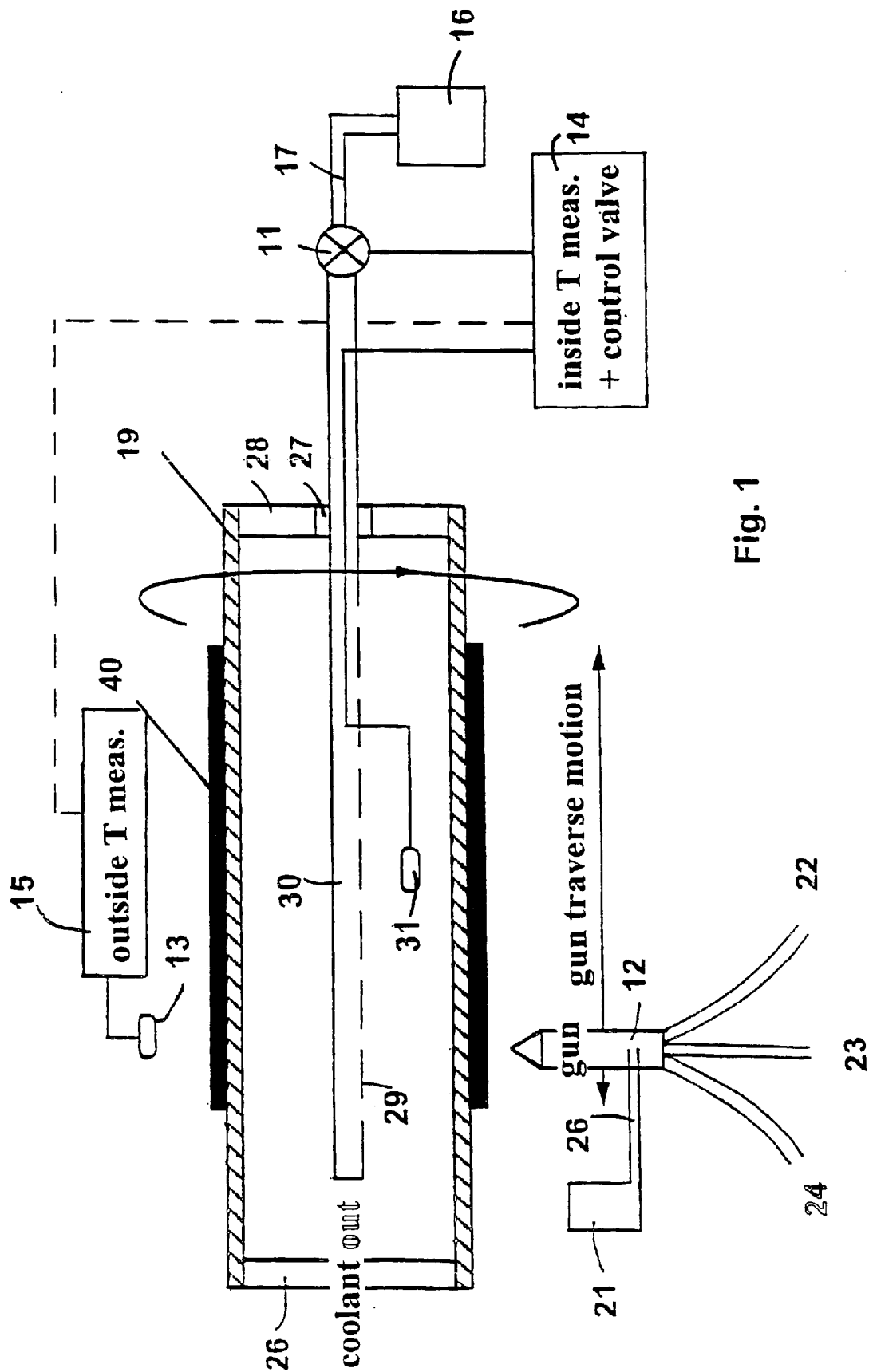
FIG. 1 is a schematic representation of a flame spraying apparatus in accordance with one embodiment of the present invention.

FIG. 1 is a schematic diagram of the flame spraying apparatus 10 in accordance with a first embodiment of the present invention. A flame spraying gun is represented schematically at 12. The gun 12 may be a commercially available flame spraying gun as for instance available from Sulzer Metco, Westbury, N.Y., USA or a high velocity oxy-fuel spraying gun available from the same company. The gun 12 may be provided with an air pincher. The gun 12 may be fed with fuel gas in pipe 22, oxygen in pipe 23 and gun cooling air in pipe 24. Additional gases may be supplied to the gun 12 as described for instance in U.S. Pat. No. 5,273,957 or EP-A413 296. Material to be coated is fed in powder or liquid form, e.g. a dry powder, a slurry of the powder and a liquid or in solution, to the gun via conduit 26 from hopper 21. Gun 12 is mounted on a drive (not shown) which provides the necessary movements of the gun 12 to coat the substrate 19. When substrate 19 is a cylindrical target, for instance, for a rotating cathode magnetron, this may be rotated and the movements of the gun 12 may be simple reciprocating movements parallel to the axis of the target 19. If the substrate 19 is a flat rectangular or circular plate, the movements may be provided by a suitable robot and may be complex, e.g. including rotational cycloidal motions. For rapid deposition several guns 12 may spray the same substrate 19 at the same time.

The fuel gas for the gun 12 may be selected from one of acetylene, propylene, hydrogen or similar fuels but the present invention is not necessarily limited thereto. Particularly preferred in one embodiment of the present invention is a fuel with a lower calorific value such as one of ethylene, natural or town gas, butane or propane as these provide a lower temperature flame than acetylene and butane is particularly preferred as it gives a stable easily controllable flame and is considered safer than acetylene if powders containing copper compounds are used. It is generally accepted that oxy-acetylene flames have temperatures of 2000° C. and more. It is preferred in accordance with an embodiment of the present invention if the flame of the flame spraying gun 12 imparts a temperature only sufficient to just melt the powder to be sprayed. Temperatures of 1500° C. or less and preferably 1200° C. or less are preferred and temperatures between 600 and 1000° C. may be more preferable. These low flame temperatures minimise decomposition of the ceramic powder components during flame spraying. Moreover, they limit the impact of evaporation of the materials to be flame sprayed and allow a deposition efficiency of more than 80%, i.e. more than 80% of the solid mass originally introduced into the gun 12, becomes attached to the substrate 19. Mechanically stable, scratch resistant flame sprayed coatings are produced with these low temperatures.

The gun 12 is preferably held at 7 to 15 cm from the substrate 19 to be coated but this depends upon the size of the flame. Similar coatings have been obtained using both oxy-acetylene flame spraying and plasma spraying. Attention must be paid to the energy taken up by the sprayed particles during the spraying and the transfer of this energy to the substrate. Intensive cooling of the substrate is preferred which may be on the side of the substrate remote from the deposited layer and/or on the same side. By altering the velocity of the particles in the flame or plasma the dwell time therein may be altered, thus limiting the energy uptake by the particles.

The material of substrate 19 preferably has a high melt temperature and a high thermal conductivity and when the substrate 19 is to be used as a target for a sputtering magnetron a good electrical conductivity is preferable. It is also preferred if the thermal expansion of the substrate material is similar to that of the ceramic coating to be applied. In accordance with embodiments of the present invention low temperature flame spraying and/or intense cooling of the substrate 19 allows the use of substrates 19 with a thermal expansion coefficient up to at least twice or down to at least a half of the thermal expansion coefficient of the ceramic coating. A non-limiting list of suitable materials may be steel, iron, stainless steel, copper or copper alloys, however the low temperature flame spraying process in accordance with the present invention, either independently or in combination with intense cryogenic cooling of the substrate 19, allows other materials to be used such as paper, cardboard or polymeric materials. Preferably, the substrate 19 should be free of grease and dry before deposition. Preferably, the outer surface of metals is sand blasted and then lapped with abrasive materials. Buffer layers between the substrate and the sprayed coating may be used such as Ni—Al or an In-alloy. These may be applied by flame or plasma spraying before application of the metal oxide coating.

Where the substrate 19 is rigid it may be mounted in a suitable jig. For example, a cylindrical substrate 19 is preferably mounted in a rotating device such as a lathe. The substrate 19 may be held by rotatable chucks at each end thereof. The temperature of the solidified flame sprayed coating 40 on the surface of the substrate 19 is preferably measured by a temperature sensor 13, 15. The sensor head 13 is preferably a remote sensing optical head which is not in contact with the surface 40 of the flame sprayed coating. The temperature to be measured is of the solidified coating 40 and not that of the coating immediately on impacting the substrate 19 which may have a higher temperature. Hence, the temperature sensor 13 is preferably mounted so that it lags behind the impact position of the flame sprayed materials a little. In addition a temperature sensor 31 may be provided inside the substrate 19 for further control of the deposition process. Control of deposition temperature is an important aspect of the present invention. Control of temperature affects the amount of thermal stress in the coating, a low stress reducing the possibility of cracks forming in the coating.

In accordance with one embodiment of the present invention a means for intense cooling of the substrate 19 is provided. This is preferably a cryogenic cooler comprising a supply 16 of cryogenic fluid and a delivery system 11, 14, 17, 29, 30. The delivery system may be adapted to the form of the substrate 19. For example, for a cylindrical substrate 19 the cooling device may be a conduit 17 for supplying the cryogenic fluid to a control valve 11, a conduit 30 with regularly spaced holes 29 for distribution of the cryogenic fluid inside the substrate 19 and a control device 14 for receiving the output of the temperature sensor 13, 15 and for controlling the operation of the control valve 11 so as to maintain the surface temperature of the solidified coating 40 to within a certain range. Particularly preferred is a temperature range from room temperature (25 to 30° C.) to 150° C. and more preferably room temperature to 100° C. These low temperatures avoid thermal stresses between the coating 40 and the substrate 19 providing a good bond and good coating density, hardness and scratch resistance thus helping to ensure the long term stability of such a coating. Using a cryogenic fluid such as liquid nitrogen (77° K.) is quite advantageous and economical as it does not require the complication of perfectly sealed rotating inlets and outlets to the substrate 19 when water or other liquid coolants are used. Additionally, cryogenic fluids such as liquid nitrogen produce large temperature gradients, thus increasing the thermal sink-effect. Other liquid coolants such as water are not excluded from the present invention.

The cylindrical substrate 19 may be sealed by a seal 26 at one end and with a rotating seal 28 at the other. The seal 28 may be provided with a sealed feedthrough 27 for the supply of cryogenic fluid. If water cooling is used, rotating seals at both ends of the cylindrical substrate are considered very important to prevent escape of water vapour into the deposition environment. In accordance with an embodiment of the present invention it is preferred if the ends 26, 27 allow escape of a cryogenic fluid which then forms a shield gas around substrate 19 during the spraying process. Particularly preferred cryogenic fluids are liquid nitrogen, liquid oxygen and liquid air. With some complex ceramic materials, one or more components may be reduced in the spraying process. For such materials it may be advantageous to use a shield gas including oxygen, e.g; liquid air or liquid oxygen, which may help to reoxidise the reduced component. On the other hand with other complex ceramics it may be advantageous to reduce the contact time with oxygen at high temperatures, under which conditions liquid nitrogen would be preferred, or a reducing gas may be included such as hydrogen. It is preferable to control the atmosphere in the vicinity of the substrate 19 during coating deposition to prevent the presence of excessive water vapour and in particular to prevent condensation of water on the substrate 19. This may be achieved by generally air conditioning the air around the substrate 19 to reduce its dew point.

It is preferred if the deposition rate is selected in order to maintain the substrate surface temperatures mentioned above. Assuming the cylindrical substrate as shown in FIG. 1, the rotation speed of the substrate 19, the linear speed of the gun 12 and the rate of material exiting the gun 12 may be controlled to achieve the temperatures specified above. For instance, it has been found that when using cylindrical substrates made of stainless steel of 15 cm diameter and up to 40 cm long, a powder delivery of 5–10 g/min was suitable to produce 3–10 mm coatings when depositing a $YBa_2Cu_3O_7$ layer. The rotational speed of the substrate 19 may be in the range 10 to 100 RPM with a surface speed in the range 1 to 40 m/min and the longitudinal feed of the gun 12 in the range 1–3 m/min, typically 2 m/min. The deposition rate per reciprocating pass of the gun 12 may be 10 to 50 micron thickness of the coating. About 10% to 15% of the deposited coating had maintained the lattice structure of the powder and exhibited superconducting properties. It will be appreciated by the skilled person that increasing the deposition speed, deposition thickness per pass or the flame temperature or reducing the thermal conductivity of the substrate material will increase the thermal load on the cooling system and adjustments of one or more of these parameters may be necessary to obtain satisfactory coatings. The thermal conductivity of the deposited material is preferably between 1 and 5 $Wm^{-1}K^{-1}$. When deposited on a steel substrate the thermal conductivity preferably lies within the range 25 to 125 $Wm^{-1}K^{-1}$. These values are particularly preferred for $YBa_2Cu_3O_7$ coatings. Preferably, an adhesion promoter layer is applied onto the substrate before application of the coating of the metal oxide combination. The adhesion promoter may be a layer of Ni—Al or a layer of an In-alloy, for example. The deposited coating is preferably impact resistant, e.g. withstands impact of a 0.036 kg steel ball from a height of 2 meters. Preferably, about 20% or up to 30% of a noble metal is included in the oxide material to improve electrical and thermal properties of the deposited layer. The noble metal is preferably silver. The noble metal may in included as a salt or oxide, e.g. silver nitrate or silver oxide, in the material to be sprayed. Preferably, the electrical resistivity of the deposited layer is lower than $15 \times 10^{-6}$ Ohm.m, more preferably lower than $10 \times 10^{-6}$ and most preferably less than $5 \times 10^{-6}$ Ohm.m. Values below $1 \times 10^{-6}$ Ohm.m can be achieved. Up to 30% of a noble metal such as silver may be added to lower the resistivity. These values are particularly preferred for $YBa_2Cu_3O_7$ coatings.

Figure 2:
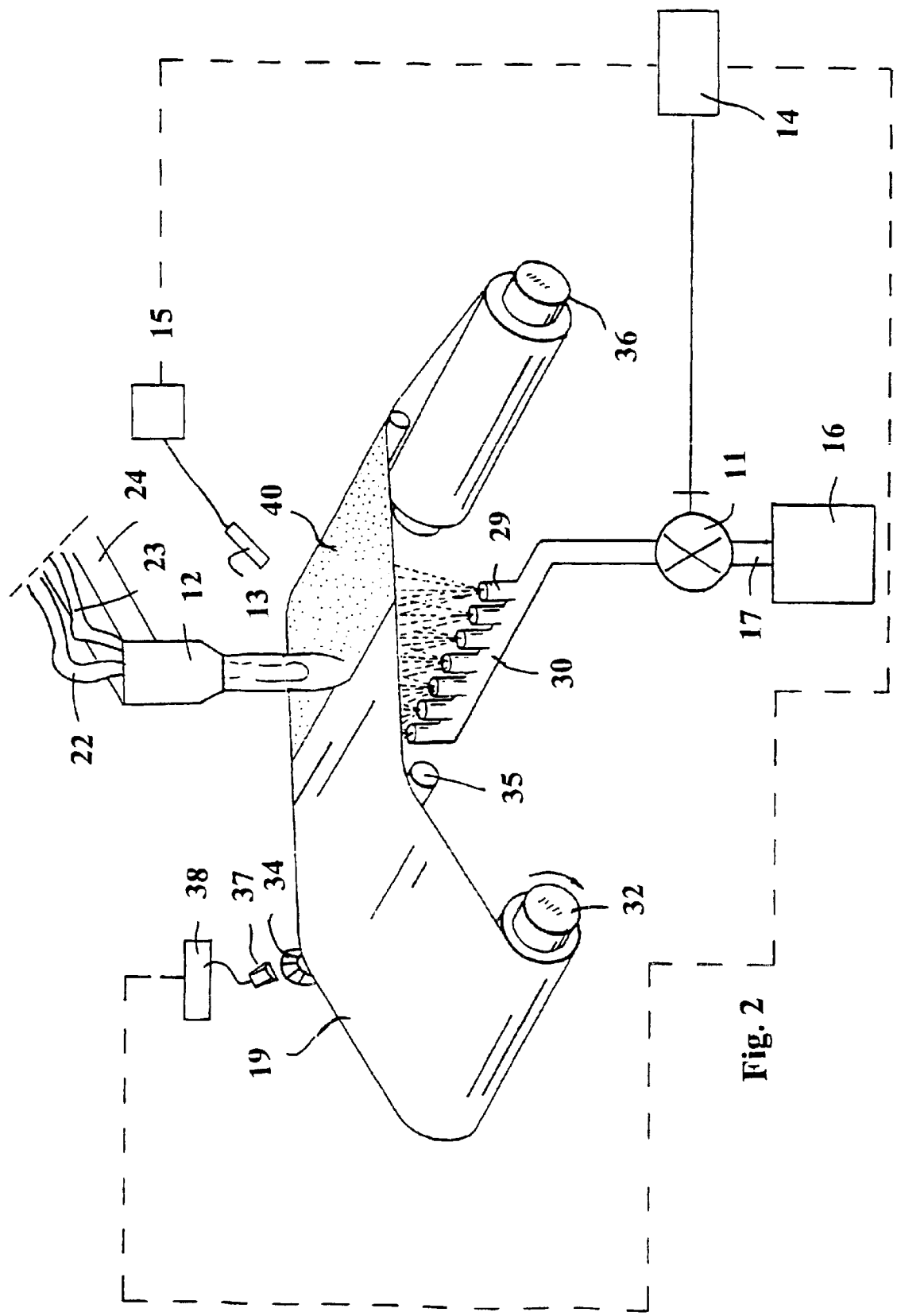
FIG. 2 is a schematic representation of a flame spraying apparatus in accordance with another embodiment of the present invention.

FIG. 2 is a schematic representation of a further embodiment of the flame spraying process and apparatus in accordance with the present invention. Components in FIG. 2 with the same reference numbers as in FIG. 1 refer to equivalent items. The substrate 19 in accordance with this embodiment is a foil or sheet of metal, plastic or other flexible material which is wound from a pay-off spool 32 to a take-up spool 36. Where the final coating 40 cannot be spooled, the foil with coating 14 may be drawn linearly from the pay-off spool 32 and cut into lengths. The coating 40, which may be a superconducting layer, is flame sprayed with a flame spray gun 12 similar to the one described with respect to FIG. 1. In particular it is preferable to use a fuel with a lower calorific value than acetylene such as natural or town gas, butane or propane. Preferably, the temperature of the flame of the gun 12 imparts a temperature of 1500° C. or less, more preferably 1200° C. or less to the material being sprayed through the flame. This material may be in the form of powder either of finished components of the coating 40, e.g. oxides, or precursors thereof, e.g. nitrates, or may be in the form of a slurry of powders, e.g. oxides, or a solution, e.g. of nitrates. Gun 12 may be controlled by hand or more preferably by a robot to provide zigzag motions across the width of foil 19 thus applying an even coating 40. Preferably a layer of 10 to 50 micron thickness is applied in each pass.

The temperature of the coating 40 may be monitored by one or more optical sensors 13, 15. The temperature of the foil 19 is regulated by means of a cryogenic fluid supplied from a container 16 to a series of holes or jets 29 via conduit 17, a controllable valve 11 and a conduit 30. The valve 11 is controlled by a controller 14 to maintain the temperature of the foil as determined by the sensor 13, 15 to less than 400° C., preferably less than 150° C. and most preferably between 50 and 100° C. Such low temperatures allow a wide range of materials for substrate 19 including polymeric materials, cellulosic materials as well as metals. Although only one controller 14 is shown the present invention includes several controllers each with its own controllable cryogenic cooling device 11, 29, 30 for individually controlling the temperature of different parts of the foil 19 or coating 40. Optionally, an optical encoder 34 may be attached to a roller 35. The optical encoder may be read with an optical sensor 37, 38, the pulse frequency generated in the sensor 37, 38 being proportional to the linear speed of the foil 19. This value may also be used by the controller 14 to control the complete process to maintain the temperatures and coating thicknesses mentioned above.

When producing superconducting coatings 40, it is preferred if there is no condensation of water onto the coating 40 nor onto the foil 19 so it is preferred if the atmosphere around the deposition equipment is air conditioned to reduce the dew point to below ambient temperature. Preferably the coated substrates in accordance with this invention are preferably stored for long periods in a plastic bag filled with a dry inert gas such as dry nitrogen. One aspect of the present invention is the flame spraying of powders which already have superconducting properties in the powder form. Using the methods in accordance with the present invention it is possible to flame spray such coatings and retain 10% to 15% of superconducting property of the coating 40 produced without extensive post-heat treatments.

The superconducting and/or ceramic powder and/or metallic powder to be used for flame spraying is preferably homogeneous, exhibits the appropriate rheological properties and correct stoichiometry to generate the required properties in the final coating. Typical preferred densities for superconducting powders may lie in the range 4 to 5 g/cm$^3$. A non-limiting list of suitable materials which may be flame sprayed as powders, slurries or liquid solutions in accordance with the present invention are: superconducting materials such as $R^1Ba_2Cu_3O_y$ where R is Y, La, Nd, Sm, Eu, Gd, Dy, Ho, Er, Tm, Yb, Lu; or $Bi_{2-x}Pb_xSr_2Ca_{n-1}Cu_nO_y$, $Tl_2Ba_2Ca_{n-1}Cu_nO_{2n+3}$, $HgBa_2Ca_{n-1}Cu_nO_{2n+2+\delta}$; or $Ba_2Ca_{n-1}O_{2n+1}$, or $CaBa_2Ca_{n-1}Cu_nO_{2n+\delta}$; or cuprate high temperature superconductors of the general formula $A_mE_2R_{n-1}Cu_nO_{2n+m+2}$ where A, E, R are selected from various cations such as A=Bi, Tl, Hg, Pb, Cu or a lanthanide element, E=Ba or Sr and R=Ca or rare earth element; or piezo-electric ceramics, for example, with the general formula $M(Zr_xTi_{1-x})O_3$ where M=Pb, Ba or Sr; or refractory ceramic oxides, nitrides, carbides or phosphates, e.g. $Al_2O_3$, MgO, $Zr_xO_y$; or metals and their alloys.

In accordance with a further embodiment of the present invention a method is provided for production of suitable ceramic powders. By starting from aqueous solutions containing the salts of the metals in the correct proportions a reactive precursor powder can be obtained using commercially available spray drying equipment in batches of kilograms. The type of salt (mostly nitrates) should preferably be compatible with thermal decomposition to oxides in further processes such as sintering or flame spraying. In accordance with the present invention spray dried nitrate powders may be flame sprayed directly or the powders may first be sintered and then flame sprayed.

Figure 3:
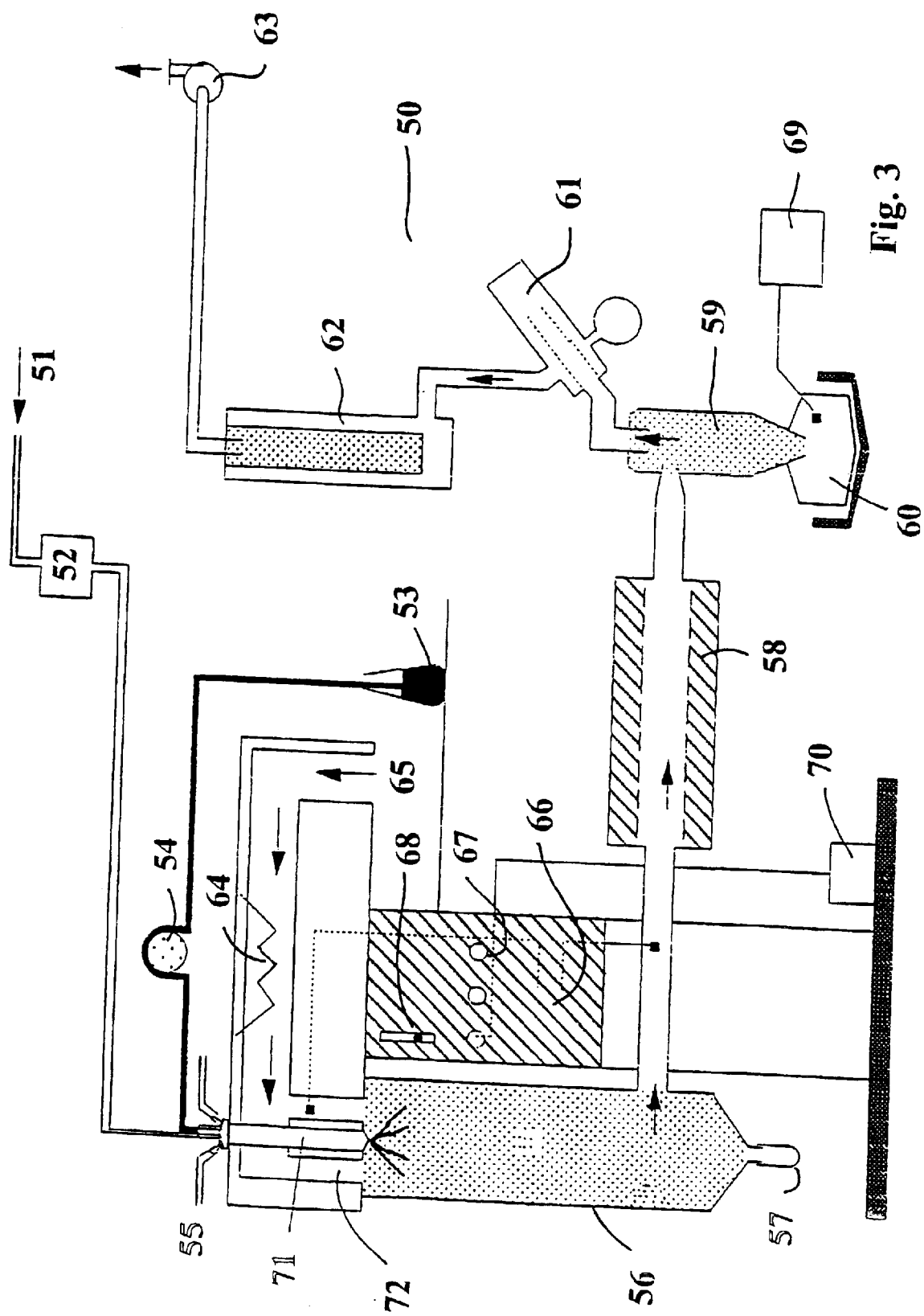
FIG. 3 is a schematic representation of a spray drying apparatus in accordance with another embodiment of the present invention.

A spray drying system 50 in accordance with an embodiment of the present invention for the delivery of powder suitable for subsequent flame spraying is shown schematically in FIG. 3. The input liquid is drawn from a suitable source 53 via a peristaltic pump 54 to a spray head 71. Pressurised air 51 is drawn in through an air dryer and optional pre-heater 52 to the spray head 71 by a suction device such as a fan 63 at the end of the generally closed system. The liquid from source 53 enters the spray head 71 which is cooled by any suitable means 55 to prevent clogging due to early evaporation of the liquid. The liquid is atomised in a co-current two fluid nozzle 71 by the dry pressurised air 51 and discharged it into a chamber 56 where it dries to a powder. The liquid from source 53 may be a solution of suitable nitrates or a slurry of the relevant oxides with the addition of other agents such as binders.

Air 65 is drawn in by fan 63 over a heater 64 and introduced into chamber 56 via a ring orifice 72 which surrounds the outlet of the spray head 71. The air 65 also heats the spray head 71. The circumferential air flow 65 guides the evaporating liquid in chamber 56 and helps to prevent the powder sticking to the walls of the chamber 56. The air throughput of fan 63 is chosen so that powder of the correct grain size is swept from chamber 36 through an optional heater section 58 into a powder collector 59. Heavier particles settle out in trap 57 and are removed from the bottom of chamber 56.

The powder collector 59 may be any suitable device such as a cyclone, a bag filter or an electrostatic filter although a cyclone is preferred. The cyclone discharges the powder into a removable container 60 sealed to the bottom of the cyclone 59. Spent air is removed via the trap 61 and scrubbed in scrubber 12 to remove impurities. The final clean air is exhausted to atmosphere by the fan 63 which controls air flow through the system.

The control system 66–70 for the process functions as follows. The rotational speed of the centrifugal air pump 53, the temperature of the heating element 64 and the flow of the atomised air are set with controller 67, 70. Air flow is measured by gauge 68. The temperature of the hot air 65 and the air in the tube leading from the chamber 56 to the optional heater 58 is monitored using thermocouples 66, whereas final powder temperature is monitored by temperature sensor 69.

After spray drying, the powder may be sintered in a single step. For example, to produce a superconducting powder of the general formula $YBa_2Cu_3O_7$ with optional Ag, the required nitrates are dissolved in water in the correct stoichiometric proportions and spray dried as indicated above. The nitrates are then reduced to oxides by sintering at 920–960° C. for 40 to 60 hours. Optionally the nitrates may first be reduced by heating in air at 780° C. for 10 hours before sintering at the above temperatures and times. The $YBa_2Cu_3O_7$ powder produced by this procedure is superconducting. On aspect of the present invention is to produce powders with superconducting properties by spray drying and optional sintering and then to flame spray these superconductive powders at the lowest flame temperatures necessary to obtain melting of the powder and coating formation on the substrate while cooling the coating in the fastest possible way. By this procedure the crystal structure present in the superconducting powder is disturbed as little as possible by the flame spraying process. Of course, melting the powder during flame spraying causes complete loss of crystal organisation if the time in the melt is long. By lowering the flame temperature and shortening the time in the melt phase by cooling the coating very rapidly in accordance with the present invention, some local crystal organisation is kept in the final flame sprayed coating, e.g. about 10% of the final coating is in the superconducting phase, thus providing a coating on the substrate with an optimum starting condition for further heat processing to develop full superconducting properties. The addition of the metallic silver enhances the thermal and mechanical properties in later flame spraying and magnetron sputtering.

Alternatively, the powder for flame spraying may be spray dried from slurries of the relevant oxides in the correct stoichiometric proportions with the optional addition of silver in the above apparatus in accordance with the present invention. For instance, in the manufacture of a ceramic material the mixture of oxides may be produced by individually sieving them to 40 micron and then mixing in the correct proportions to obtain the stoichiometric proportions in the final coating. A quantity of deionised water is added of about 60% by weight of the powder as well as a quantity of an organic binder such as PVA (polyvinyl acetate) equal to about 2% by weight of the powder and then mixed into a slurry. The slurry is then spray dried as described above resulting in powder with a grain size from 30 to 50 micron. Generally, spray dried oxide slurries do not require sintering before flame spraying. The organic binder may be burnt out during flame spraying or in a special sintering step.

Spray drying of 10% by weight nitrate solutions generally produce grain sizes of 3 micron on average with at least 90% of the grains between 0.5 and 5 microns. In order to obtain the required grain size it is preferable to sinter as mentioned above. Light grinding and sieving of this sintered powder may produce a mass fraction of more than 80% with grain sizes between 40 and 80 micron. By the variation of appropriate concentrations of the solution of the aqueous media 53, and/or the addition of binders and/or the spray drying of slurries rather than solutions, allows control of the grain size in the final powder to between 2 and 100 microns. For example, the present invention includes the addition of organic binders such as polyvinyl acetate (PVA) to the liquid to be spray dried to control grain size in the final powder. Such binders may be burnt out in a later high temperature process such as sintering. An average grain size of 40 to 80 microns is preferred for good flame spray deposition. The final powder may be lightly milled and sieved to be improve the homogeneity of grain sizes.

One aspect of the present invention is the inclusion of silver metal in the final superconducting ceramic coating. This is achieved as mentioned above by inclusion of about 20% to 30% by weight of the ceramic materials of silver nitrate when nitrate solutions are spray dried and the flame sprayed or by addition of $Ag_2O$ powder in an oxide slurry which is then spray dried and flame sprayed. The addition of silver in the flame sprayed material is beneficial for the inter-grain adhesion and heat dispersal during flame spraying thus yielding a strong and dense coating. The silver improves the thermal and electrical conductivity of the flame sprayed coating which is beneficial to the sputtering process when the substrate is used as a sputtering target. The improved conductivities allow higher power throughput for the magnetron than targets not containing silver.

The flame spraying process in accordance with the present invention allows the reconditioning of targets for sputtering magnetrons. It is well known that the presence of a static race-track plasma on a magnetron target during sputtering results in an erosion groove and poor target utilisation. Using the flame spraying process of the present invention such a worn target may be reconditioned by spraying the appropriate target material into the erosion groove and building up the target to its former thickness in these regions. By providing the intensive cryogenic cooling described above, the general target temperature may be kept below 400° C., preferably below 150° C. and most preferably between room temperature (~25° C.) and 100° C. These low temperatures result in little damage to the existing target material while still providing a mechanically strong coating in the old erosion grooves. Such as process is particularly economic when the target material is expensive such as superconducting materials. The flame spraying gun 12 described above may be hand held and the contour of the erosion groove in the used target followed building up the lost material slowly, preferably 10 to 50 micron per pass. Preferably the gun 12 is controlled by a robot which is programmed to execute the correct motions with the gun 12 to fill up the erosion groove in the target.

While the invention has been shown and described with reference to preferred embodiments, it will be understood by those skilled in the art that various changes or modifications in form and detail may be made without departing from the scope and spirit of this invention as defined in the attached claims.

What is claimed is:

1. A method of depositing by flame or plasma spraying at atmospheric pressure a layer onto a substrate, the layer having a thickness of at last 5 mm, the coating comprising metal oxides, the method including the steps of:

depositing an additional noble metal with the coating to increase thermal conductivity of the coating, and during deposition of the coating, cooling the substrate so that the solidified coating thereon has a temperature between 25 and 150° C.

2. The method of claim 1, wherein the temperature of the solidified coating during deposition is held at between 50 and 100° C.

3. The method according to claim 1, wherein the noble metal is silver.

4. The method according to claim 3, wherein silver containing material is included in material to be sprayed to result in up to 30% silver in the coating as deposited.

5. The method according to claim 1, wherein the spraying step includes spraying a material through a spraying head, the material being in the form of one of a powder, a slurry or a solution.

6. The method according to claim 1, wherein the cooling is with a cryogenic liquid.

7. The method according to claim 1, wherein the coating comprises a superconductive precursor and at least 10% of the layer is in a superconductive phase is deposited.

8. The method according to claim 3, wherein the layer has a thickness of greater than 8 mm.

9. A composite comprising: a substrate and a coating obtained by the method of claim 1, the thickness of the coating being at least 5 mm, the coating comprising metal oxides and the deposited coating comprising the addition of a noble metal to increase thermal conductivity of the coating.

* * * * *